United States Patent
Gao et al.

(10) Patent No.: US 11,598,735 B2
(45) Date of Patent: Mar. 7, 2023

(54) COMBINED DISCRETE GAUSSIAN ANALYSIS OF MICP AND NMR T2 DISTRIBUTIONS OF MULTI-MODAL CARBONATE ROCKS

(71) Applicant: SAUDI ARABIAN OIL COMPANY, Dhahran (SA)

(72) Inventors: Jun Gao, Dhahran (SA); Hyung Tae Kwak, Dhahran (SA); Marwah M. AlSinan, Al Qatif (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 157 days.

(21) Appl. No.: 17/209,824

(22) Filed: Mar. 23, 2021

(65) Prior Publication Data

US 2022/0307998 A1 Sep. 29, 2022

(51) Int. Cl.
  *G01N 24/08* (2006.01)
  *G01N 15/08* (2006.01)
  *G01V 3/38* (2006.01)

(52) U.S. Cl.
  CPC ....... *G01N 24/081* (2013.01); *G01N 15/0886* (2013.01); *G01V 3/38* (2013.01)

(58) Field of Classification Search
  None
  See application file for complete search history.

(56) References Cited

U.S. PATENT DOCUMENTS

| | | | |
|---|---|---|---|
| 6,008,645 | A | 12/1999 | Bowers et al. |
| 9,081,117 | B2 | 7/2015 | Wu et al. |
| 9,671,525 | B2 | 6/2017 | Al-Ibrahim et al. |
| 10,324,229 | B2 | 6/2019 | Theologou et al. |
| 10,551,520 | B2 | 2/2020 | Saidian et al. |
| 2020/0173902 | A1 | 6/2020 | Wang |

FOREIGN PATENT DOCUMENTS

CN 110161071 A 8/2019

OTHER PUBLICATIONS

An MICP-Based Pore Typing Workflow-Core Scale to Log Scale, Theologou et al. SPWLA 56th Annual Logging Symposium, (Year: 2015).*

(Continued)

*Primary Examiner* — Douglas X Rodriguez
(74) *Attorney, Agent, or Firm* — Osha Bergman Watanabe & Burton LLP (57) ABSTRACT

A method includes screening heterogeneity of a rock sample using nuclear magnetic resonance testing to determine a composition of the rock sample, drilling at least one smaller rock sample representative of the determined composition, and testing the at least one smaller rock sample with mercury injection capillary pressure to obtain a capillary pressure distribution of the at least one smaller rock sample. The method further includes decomposing a $T_2$ distribution from the nuclear magnetic resonance testing and the capillary pressure distribution using Gaussian fitting to identify multiple pore systems, where the small ends of the Gaussian fitted $T_2$ distribution and the Gaussian fitted capillary pressure distribution are overlapped for at least one of the identified pore systems.

20 Claims, 7 Drawing Sheets

(56) References Cited

OTHER PUBLICATIONS

International Search Report and Written Opinion issued in Application No. PCT/US2022/021571, dated Jun. 21, 2022 (18 pages).
Qu et al.; "Pore-throat structure and fractal characteristics of tight sandstones in Yanchang Formation, Ordos Basin", Marine and Petroleum Geology; vol. 120; Jul. 2, 2020; pp. 1-15 (15 pages).
Brandimarte, Fabian et al., "How to Obtain Primary Capillary Pressure Curves Using NMR T2 Distributions in a Heterogeneous Carbonate Reservoir", SCA2017-066, pp. 1-9 (9 pages).
Daigle, Hugh and Andrew Johnson, "Combining Mercury Intrusion and Nuclear Magnetic Resonance Measurements Using Percolation Theory", Transport in Porous Media, Springer Science+Business Media Dordrecht, vol. 111, No. 3, Dec. 2015, pp. 669-679 (11 pages).
Marschall, D. et al., "Method for Correlating NMR Relaxometry and Mercury Injection Data", SCA Conference Paper No. 9511, 1995, pp. 1-12 (12 pages).
Moss, Adam K. et al., "An Investigation into Different Correlation Methods between NMR T2 Distributions and Primary Drainage Capillary Pressure Curves Using an Extensive Sandstone Database", E3S Web of Conferences, The Authors, EDP Sciences, vol. 89, No. 02003, 2019, pp. 1-9 (9 pages).

\* cited by examiner

COMBINED DISCRETE GAUSSIAN ANALYSIS OF MICP AND NMR T2 DISTRIBUTIONS OF MULTI-MODAL CARBONATE ROCKS

BACKGROUND

Figure 1:
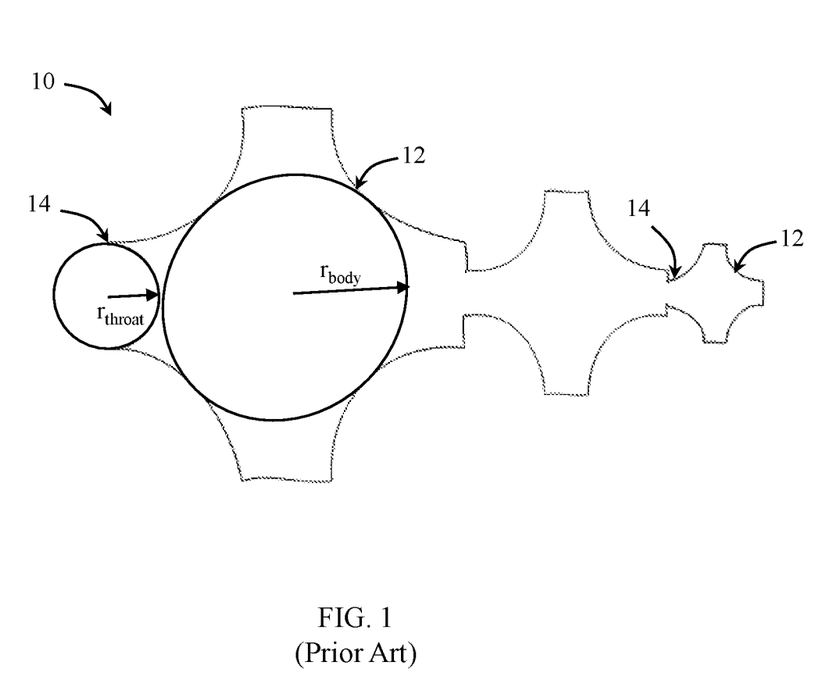
FIG. 1 shows an example of a conventional pore structure in a porous rock sample.

Pore size distribution is an important property of porous oil reservoir rocks used to determine how oil and water occupy different microscopic locations in the reservoir rocks and how oil flows out during oil production. A typical ball-stick representation of pore space 10 in reservoir rocks is shown in FIG. 1. The larger pore space referred to as a pore body 12 is connected through smaller pore space referred to as a pore throat 14. FIG. 1 shows a simplified diagram of interconnected pore space, where the actual 3D pore space may include irregular-shaped pore bodies interconnected by pore throats of different sizes.

During an operation, reservoir rock may be filled with water before oil migration. For oil migration, the oil drop needs to overcome the entry (drainage) capillary pressure as a function of $r_{throat}$ size since the rock is initially water wet. After oil passes the pore throat, it fills the larger pore body with the size of $r_{body}$ under the same entry pressure. Thus, the pore body-throat ratio and the body-throat connecting numbers are important parameters of a rock pore space to predict oil migration through the pore space. The body-throat connecting number refers to the number of throats connecting to a pore body. For example, FIG. 1 shows a pore body 12 having a body-throat connecting number of 4, where the pore body 12 is connected to four pore throats 14.

Different pore size distribution methods have been used to characterize different aspects of the complex pore space in reservoir rocks. The different methods reveal different information on the complex microscopic space, depending on how the measurement is conducted.

The most straightforward methods include imaging methods, such as thin-section, microtomography (μCT) and scanning electron microscope (SEM) scanning, which may be used to directly measure the size of the pore space. 3D parameters can be derived from the 2D images based on stereology. When using such imaging methods, obtaining the correct images of microscopic space proves to be the biggest challenge. For example, the image resolution of a thin-section sample by optical microscopy is only sufficient for pore spaces larger than about several microns, which is best for large pore bodies of high permeability rocks, while pore throat may not be measured accurately for most rocks.

Another pore characterization method includes mercury injection capillary pressure (MICP) testing. MICP testing includes injecting mercury into a porous rock sample with increasing pressures to quantify the pore throat size. The mercury pressure can be sufficiently high (e.g., about 60,000 psi) to fill up the smallest pore space (e.g., about 0.0036 μm) so that the complete pore throat distribution of the most porous rocks can be obtained. Since the oil/water distribution is primarily controlled by pore throat instead of the pore body size distribution, capillary pressure is central to the oil industry when studying the oil/water distribution. However, pore throat size does not reflect the pore body size on which some petrophysical properties depend.

Another pore characterization method includes nuclear magnetic resonance (NMR) testing, where a rock sample may be positioned in a magnetic field, and the interaction of nuclear spins in the sample may be analyzed to obtain different properties of the sample. NMR tools may measure the decaying signals of the nuclear spin of the protons at various times in response to a magnetic field, where the signal decaying time for the protons to complete dephasing may be referred to as the $T_2$ relaxation time. The NMR measurements of amplitude versus time may be used to determine the $T_2$ distribution of the sample, which may be used to calculate other properties of the sample such as porosity and permeability. For example, NMR well logging is commonly used to obtain petrochemical properties of a formation and formation fluids.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments of the present disclosure relate to methods that include screening heterogeneity of a rock sample using nuclear magnetic resonance testing to determine a composition of the rock sample, drilling at least one smaller rock sample representative of the determined composition, testing the at least one smaller rock sample with mercury injection capillary pressure to obtain a capillary pressure distribution of the at least one smaller rock sample, decomposing a $T_2$ distribution from the nuclear magnetic resonance testing and the capillary pressure distribution using Gaussian fitting to identify multiple pore systems, and overlapping small ends of the Gaussian fitted $T_2$ distribution and the Gaussian fitted capillary pressure distribution for at least one of the identified pore systems.

In another aspect, embodiments of the present disclosure relate to methods that include generating a $T_2$ distribution of nuclear magnetic resonance data from a multi-modal carbonate rock sample, generating a capillary pressure distribution from mercury injection capillary pressure testing of a representative rock sample, decomposing the $T_2$ distribution using Gaussian fitting to identify at least a first pore system in the multi-modal carbonate rock sample, overlapping small ends of the Gaussian fitted $T_2$ distribution and the capillary pressure distribution for the first pore system, and calculating a scaling factor for the first pore system.

In yet another aspect, embodiments of the present disclosure relate to methods that include generating a $T_2$ distribution of nuclear magnetic resonance data from a multi-modal porous rock sample, generating a capillary pressure distribution from mercury injection capillary pressure testing of a representative rock sample, decomposing the $T_2$ distribution using Gaussian fitting to identify multiple pore systems in the multi-modal porous rock sample, overlapping small ends of the Gaussian fitted $T_2$ distribution and a Gaussian fit of the capillary pressure distribution for each of the identified pore systems, and matching peaks of the Gaussian fitted $T_2$ distribution and the Gaussian fitted capillary pressure distribution while the overlapped small ends are fixed. From the matching curves, methods may further include determining a surface relaxivity for each of the identified pore systems based on the overlapped small ends of the distributions, determining a scaling factor for each of the identified pore systems based on the surface relaxivity and the matched peaks of the distributions, and determining a pore body-throat ratio of each of the identified pore system based on the scaling factor and the surface relaxivity.

Other aspects and advantages of the claimed subject matter will be apparent from the following description and the appended claims.

DETAILED DESCRIPTION

In one aspect, embodiments disclosed herein relate to methods for determining pore network properties of porous rocks. In another aspect, embodiments disclosed herein relate to methods for correlating MICP data and NMR $T_2$ distribution data to obtain properties of multi-modal porous rocks. Embodiments disclosed herein may include identifying one or more pore systems in formation rock and determining a scaling factor for each pore system from NMR and MICP data in order to correlate MICP and NMR data for multi-modal porous rocks. Such methods may be useful, for example, to convert NMR $T_2$ distributions to capillary pressure curves and calculate water saturations.

Figure 2:
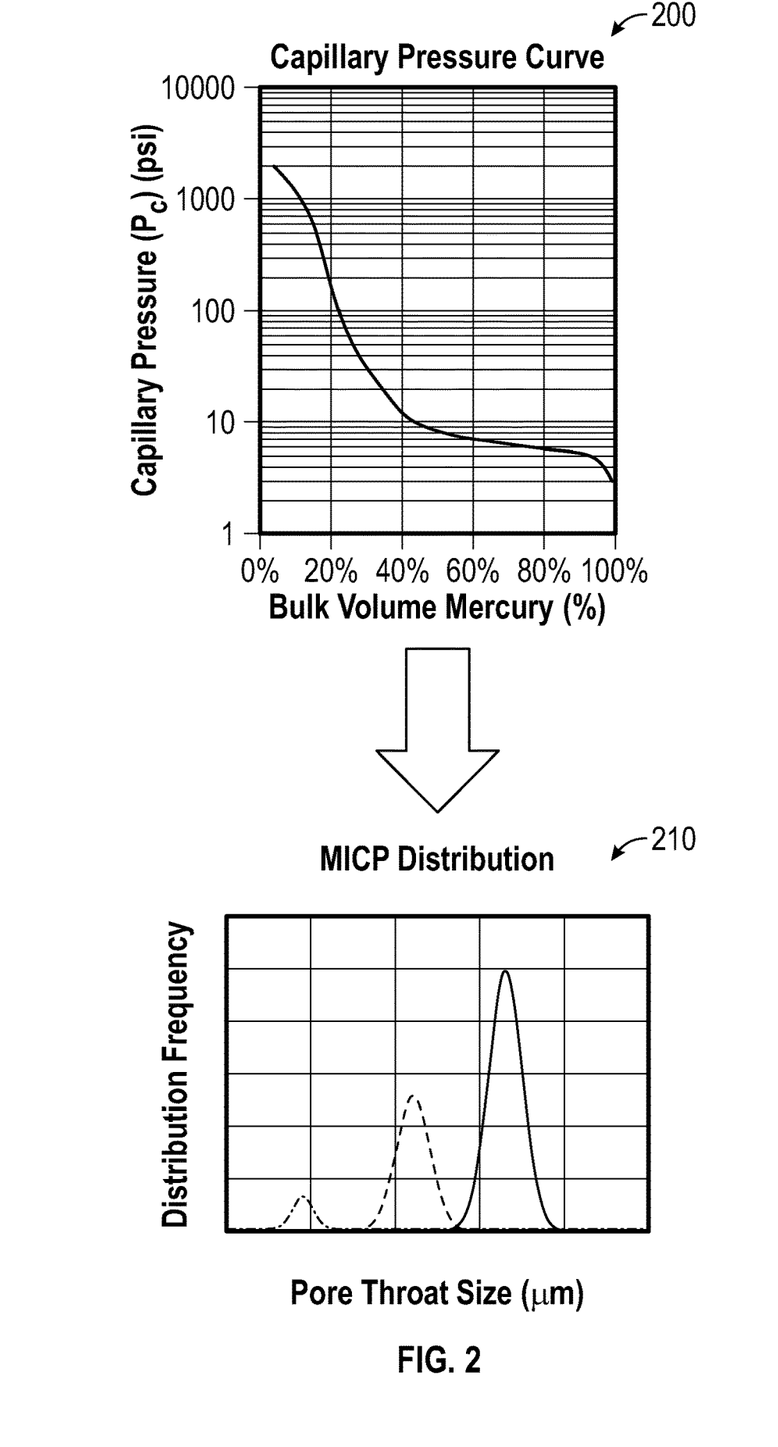
FIG. 2 shows an example of a capillary pressure distribution curve.

Capillary pressure may be used in reservoir simulators for predicting and analyzing well performance. Conventionally, capillary pressure in a reservoir has been determined by performing many MICP experiments on different reservoir rock samples from the reservoir of interest, which may be a relatively expensive and slow process. MICP experiments may use a mercury and air system, where mercury is pushed through the porous rock sample at increasing pressures. The capillary pressure curve derived from an MICP experiment may show the relationship between the capillary pressure in the sample and the size of the pore throats the mercury is pushed through, where mercury may be pushed through relatively larger pore throats at relatively lower pressures and mercury may be pushed through relatively smaller pore throats at relatively higher pressures. Capillary pressure curves generated from MICP experiments may sometimes be referred to as MICP curves. For example, FIG. 2 shows a typical MICP curve 200 showing the relationship between capillary pressure and the amount of mercury pushed through the sample. Because different fluid systems are found in reservoirs of interest (e.g., an oil, gas, and/or water fluid system), a conversion based on the fluid properties may be used to convert analysis data from the mercury system of the MICP experiments to the reservoir fluid system.

The pore throat size distribution of a sample may be derived from capillary pressure results of MICP experiments based on Equation 1, below:

$$r_{throat} = \frac{2\sigma\cos\theta}{P_c} \qquad \text{Eq. 1}$$

In Equation 1, $P_c$ is the capillary pressure, $\sigma$ is the surface tension (480 dyne/cm for mercury/air or vacuum), and $\theta$ is the contact angle (140° for mercury/rock). Based on Equation 1, the pore throat size distribution as a function of the saturation in the commonly-used log scale can be derived from mercury injection capillary pressure, as shown in Equation 2, where S is the saturation:

$$f(r_{throat}) = \frac{dS}{d(\log(P_c))} \qquad \text{Eq. 2}$$

Using Equation 2, capillary pressure curves showing the relationship between capillary pressure and the amount of mercury pushed through the sample may be converted to an MICP distribution curve showing the relationship between pore throat size and the pore throat size distribution frequency. For example, referring again to FIG. 2, a capillary pressure curve 200 may be converted to an MICP distribution curve 210 to show the relationship between the pore throat size and the pore throat size distribution frequency for rock samples subjected to MICP experiments.

Because conventional use of MICP experiments to form capillary pressure curves have previously used multiple physical rock samples from a reservoir of interest (and thus providing sparse data points), capillary pressure models often included extrapolated curves, which may lead to inaccurate reservoir simulation predictions. To improve the accuracy of capillary pressure models, data from NMR measurements may be used. When using NMR data in conjunction with MICP data to provide a capillary pressure model, the data may be correlated according to embodiments disclosed herein.

Figure 3:
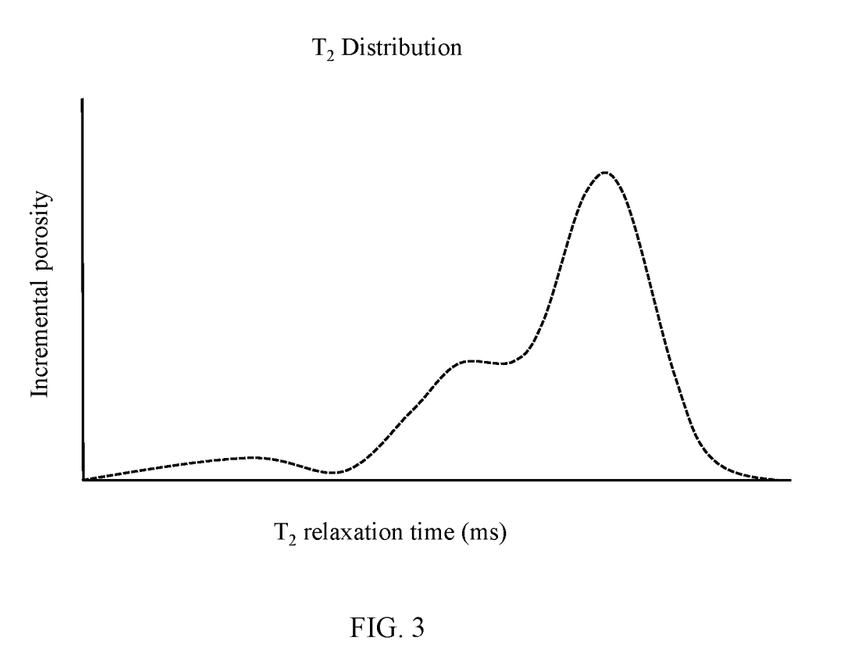
FIG. 3 shows an example of a $T_2$ distribution curve.

NMR data may be collected from a formation of interest to use for characterizing the formation rock and fluids therein. For example, NMR logging tools may be sent downhole to collect NMR data from a formation as the NMR logging tool is moved through the formation. In some embodiments, samples of a formation may be brought to the surface (e.g., in a lab), where NMR measurements may be taken of the formation sample(s). An NMR tool (e.g., an NMR well logging tool) may induce a magnetic field around a nearby rock sample, which may polarize hydrogen nuclei in fluids held in the rock. When the magnetic field is turned off, the nuclei may relax, and the NMR tool may measure the relaxation time. Because the magnetic field and relaxation response may be effectively measured for fluids but not minerals, the NMR measurements may be used to determine fluid amounts in the rock sample, thereby indicating pore systems in the rock. The amplitude of the response from the nuclei may be correlated to the incremental porosity of the sample and plotted as a function of time, as shown in FIG. 3.

Data collected from NMR may be used in empirical models to predict permeability of a rock. For example, the transverse relaxation time, $T_2$, distributions from NMR measurements may be used as a representation of the rock pore size distribution. Equation 3, below, shows the relationship between transverse relaxation time, $T_2$, and properties of the rock that may be used to indicate pore size.

$$\frac{1}{T_2} = \rho_2 \frac{S}{V} + \frac{1}{T_{2bulk}} + \frac{(\gamma GTE)^2 D}{12} \approx \rho_2 \frac{S}{V} = \rho_2 \frac{3}{r_{body}} \text{ (spherical pores)} \quad \text{Eq. 3}$$

In Equation 3, $T_2$ is the transverse relaxation time, $\rho_2$ is the surface relaxivity, S is the surface area, V is the volume, $T_{2bulk}$ is bulk water relaxation time, $\gamma$ is proton gyromagnetic ratio, G is the (internal) gradient strength, TE is the time of echo, and D is the diffusion coefficient. The $T_{2bulk}$ may be much larger than the measured $T_2$, while current TE values of typical laboratory NMR instruments may be small, e.g., around 0.06 ms or less. The two terms, $$\left[\frac{1}{T_{2bulk}}\right] \text{ and } \left[\frac{(\gamma GTE)^2 D}{12}\right]$$

may be ignored due to the negligible effects of bulk relaxation and diffusion, as shown in the reduction of Equation 3. From the simplified relationship shown in Equation 3, $T_2$ is shown to be dependent on surface relaxivity, $\rho_2$, and pore geometry (S/V). $T_2$ transverse relaxation data may also be correlated between $T_1$ longitudinal relaxation data according to known methods.

The surface relaxivity, $\rho_2$, is the intrinsic property of the rock surface related to its population of paramagnetic ions, and S/V indicates the pore size in the rock. As shown in Equation 3, the pore size S/V of a spherical pore may equal $3/r_{body}$. If the surface relaxivity, $\rho_2$, is known, the $T_2$ distribution from NMR measurements may be converted to pore body size.

Because $T_2$ distribution measurement is non-destructive and easy to run in 100% water-saturated rocks and because NMR logging is commonly used, correlating pore throat size between MICP and $T_2$ distribution may provide a more efficient method for investigating the pore network in a formation. For rocks with simple pore size distribution such as a mono-modal pore distribution, conversions may be found satisfactorily by using one scaling factor. Scaling a pore throat size distribution from MICP to $T_2$ distribution using a single scaling factor may be determined based on Equations 1-3, as shown in Equation 4:

$$T_2 = \frac{Cr_{throat}}{\rho_2 R} = \frac{Cr_{throat}}{\rho_e} \quad \text{Eq. 4}$$

Equation 4 converts MICP pore radii to equivalent $T_2$ values, thereby providing a common scale for MICP and $T_2$ distributions. In Equation 4, the effective relaxivity ($\rho_e$, μm/ms) is introduced to account for NMR data responding to pore body size while MICP data is affected by pore throat sizes. The effective relaxivity, $\rho_e$, lumps two parameters together: the intrinsic surface relaxivity ($\rho_2$) and a pore geometrical factor, the body-throat size ratio (R). C is a unit constant, which may be obtained by overlapping an MICP distribution and an NMR $T_2$ distribution of a sample for a "good fit," to where the general shapes of the MICP and T2 distributions match when overlapped. Distribution matching may include finding an effective relaxivity, $\rho_e$, value that minimizes the cross-correlation function shown in Equation 5, below, and/or by comparing the median pore size and $T_2$ long mean from the $T_2$ distribution.

$$C(\rho_e) = \Sigma \, a_{NMR}(T_2) \cdot a_{MICP}\left(\frac{1000 r_{throat}}{2\rho_e}\right) \quad \text{Eq. 5}$$

In Equation 5, $\alpha_{NMR}$ and $\alpha_{MICP}$ are the amplitudes of the NMR $T_2$ and MICP distributions, respectively. Thus, pore bodies and pore throats may be collectively represented by the relationship between NMR and capillary pressure data, where pore size may be calculated based on the $T_2$ pore size distributions from NMR, and capillary pressure curves may be determined using experiments such as MICP experiments to derive a throat size distribution.

One scaling factor may assume a constant surface relaxivity and pore body-throat ratio over the whole distribution, which works well in rocks with simple pore size distribution such as mono-modal, especially when both distribution curves have similar shapes.

For rocks with complex and wide distributions such as multi-modal carbonates, the conversion by one scaling factor may not render a good match, for example, when the MICP and $T_2$ distribution curves have different shapes. The scaling factor as a function of the saturation may be obtained from a direct comparison of two cumulative distributions for better conversion. However, the scaling factor curves obtained at each saturation appear to have arbitrary or empirical shapes, which do not seem to be related to its physical base of intrinsic relaxivity and pore body-throat ratio.

The mismatch of complex distributions using one scaling factor and the arbitrary shape of the scaling factor function may not adequately consider differences among multi-modal pore systems. Multiple pore systems present within a rock with wide distributions may be due to different origins. For example, the macro-pores of some carbonates may mostly include inter-particles formed during deposition, while the micro-pores may be formed from diagenesis. A "pore system" may refer to a network of pores within rock that have similar properties, including intrinsic relaxivity and body-throat ratio. For example, a pore system may be identified as a network of pores having a pore size within a selected size range. In some embodiments, pore systems may be divided into different groups such as interparticle and inter-crystalline pores. A pore system may be distributed throughout a layer of formation, or a pore system may be discretely located within an area of a formation. Pore systems may be identified using different techniques, such as imaging, scanning, and microscopic techniques.

Embodiments disclosed herein may include using one or more methods of identifying and matching pore systems within rock samples in order to provide more accurate conversion between MICP and NMR data.

In some embodiments, the heterogeneity of a rock may be initially assessed using a spatial $T_2$ scan along a length of the rock and/or using other geological studies, such as one or more of imaging, μCT scans, SEM analysis, microscopic analysis, and geological testing. As used herein, the term heterogeneity may refer to core-scale differences. For example, a small carbonate core plug may have heterogeneity detected in the laboratory as including portions with different porosity, permeability, and/or pore systems. A spatial $T_2$ scan may indicate the $T_2$ distributions (and thus pore systems) along the core length. These distributions could be very close, or they could be different. For example, when analyzing a spatial $T_2$ distribution from a rock sample, which may be obtained from NMR measurements taken along a length of rock, the spatial $T_2$ distribution curve may have one or more identifiable peaks corresponding to different locations along the length of the rock. When analyzing carbonate rocks, which may have complex pore distributions, the spatial $T_2$ distribution may have one peak, two or more distinctive peaks, or a wide distribution of adjacent peaks.

Figure 7:
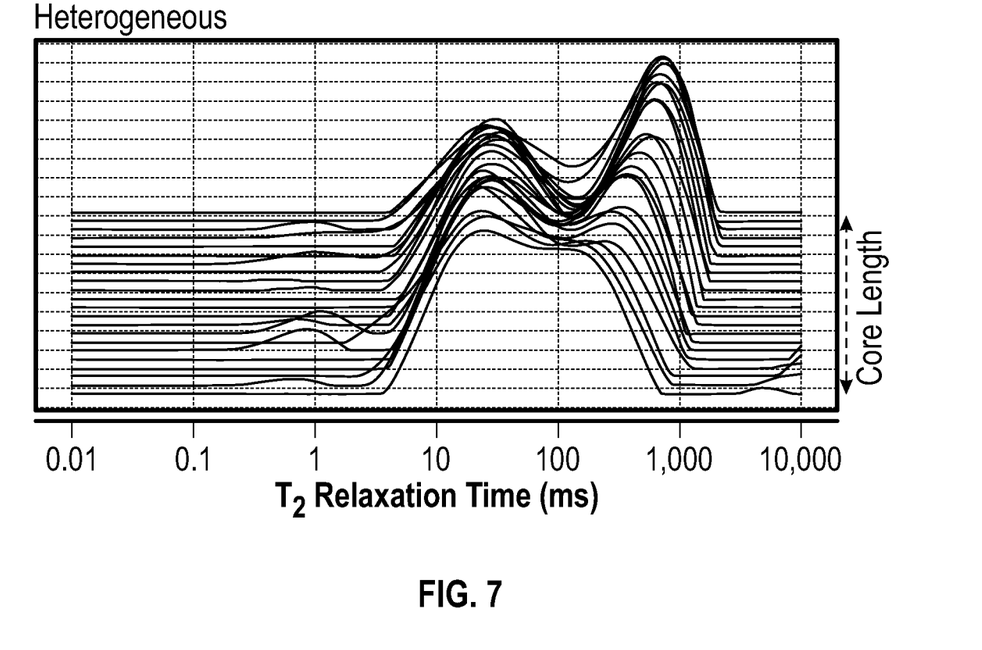
FIG. 7 shows a spatial $T_2$ distribution of a heterogeneous rock sample.
Figure 8:
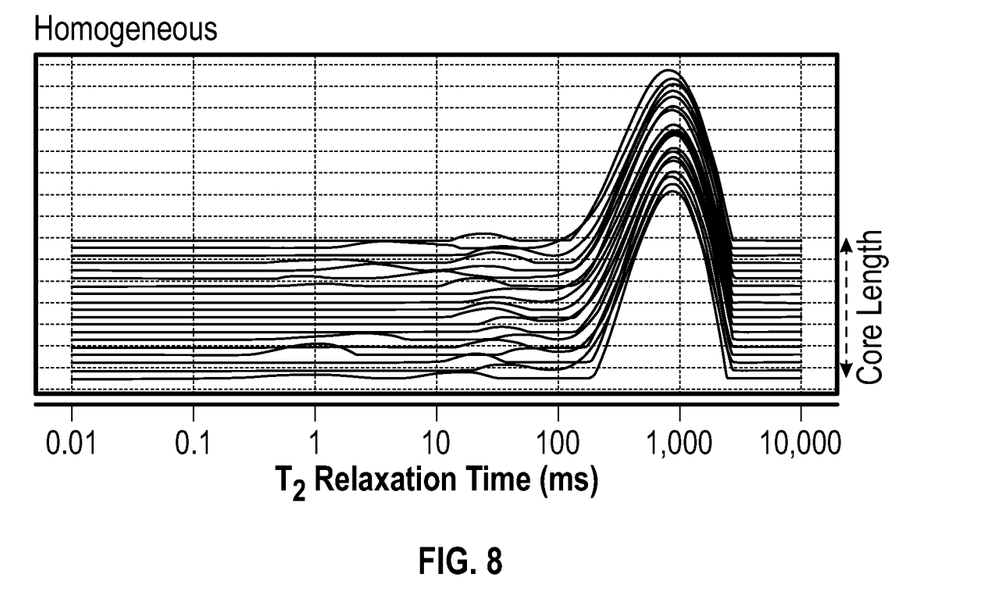
FIG. 8 shows a spatial $T_2$ distribution of a homogeneous rock sample.

For example, FIGS. 7 and 8 show examples of spatial $T_2$ distributions taken along the length of a heterogeneous rock sample (shown in FIG. 7) and a homogeneous rock sample (shown in FIG. 8), which may be used to initially assess the heterogeneity of each rock sample. The spatial $T_2$ distribution of the heterogeneous rock sample shown in FIG. 7 includes multiple $T_2$ peaks along the length of the sample, thereby indicating its heterogeneity. The spatial $T_2$ distribution of the rock sample shown in FIG. 8 has a single $T_2$ peak along the length of the sample, thereby indicating the homogeneity of the sample.

Initially assessing the heterogeneity of a rock may allow for assurances that the same composition of rock is being used when correlating MICP and $T_2$ distributions. For example, in some embodiments, methods may include screening heterogeneity of a rock sample using NMR testing to determine a composition of the rock sample and drilling at least one smaller rock sample representative of the determined composition to perform an MICP test and an NMR test on each of the smaller rock samples. A $T_2$ distribution and MICP distribution of the rock samples having the same composition may then be analyzed and correlated according to methods disclosed herein.

In some embodiments, screening the heterogeneity of rock may include moving an NMR tool (e.g., an NMR logging tool) along a length of the rock and generating a spatial $T_2$ distribution from the obtained NMR data. From the spatial $T_2$ distribution and/or using other geological testing, different compositions in the rock may be identified. MICP rock samples may be drilled from rock having the same composition identified from the heterogeneity screening. In some embodiments, MICP rock samples may be smaller in size than NMR rock samples. For example, in some embodiments, an MICP rock sample may be taken from a larger rock sample used for the spatial $T_2$ testing, where the MICP testing of the MICP rock sample may be correlated with the $T_2$ distribution from the same location/same rock sample. In some embodiments, MICP rock samples may have a size ranging between 0.5 and 3 inches in diameter and between 0.5 and 3 inches in length. An NMR rock sample may be a larger drilled plug or may be an in-place underground formation, where NMR data may be collected by running an NMR logging tool through the formation. In some embodiments, the same rock sample may be used for generating both $T_2$ distributions and MICP distributions to assure representativeness.

For example, initial heterogeneity screening may be well suited for carbonate rocks, which generally have complex and multi-modal pore systems. Carbonate rocks may include sedimentary type rocks made of carbonate minerals such as limestone and dolomite. In carbonate rock-types, the variation in pore systems may cause a large variation in permeability through the rock, thereby making prediction and modeling of well performance difficult. By identifying different compositions and/or microstructures in the carbonate rock (or in other multi-modal porous rock) and using representative samples for MICP testing, accuracy of a correlation between $T_2$ and MICP distributions from the samples may be improved.

Pore systems may be identified in rocks having different types of pore distribution systems, e.g., mono-, bi-, or tri-modal distribution, from MICP and $T_2$ distributions, where each identified pore system may have similar properties (e.g., intrinsic relaxivity and body-throat ratio). For example, different pore systems may have different body-throat ratios. Additionally, but to a lesser extent, intrinsic relaxivity may vary from micro- to macro-pores. Each identified pore system may then be separately correlated between the MICP and $T_2$ distributions.

Figure 4:
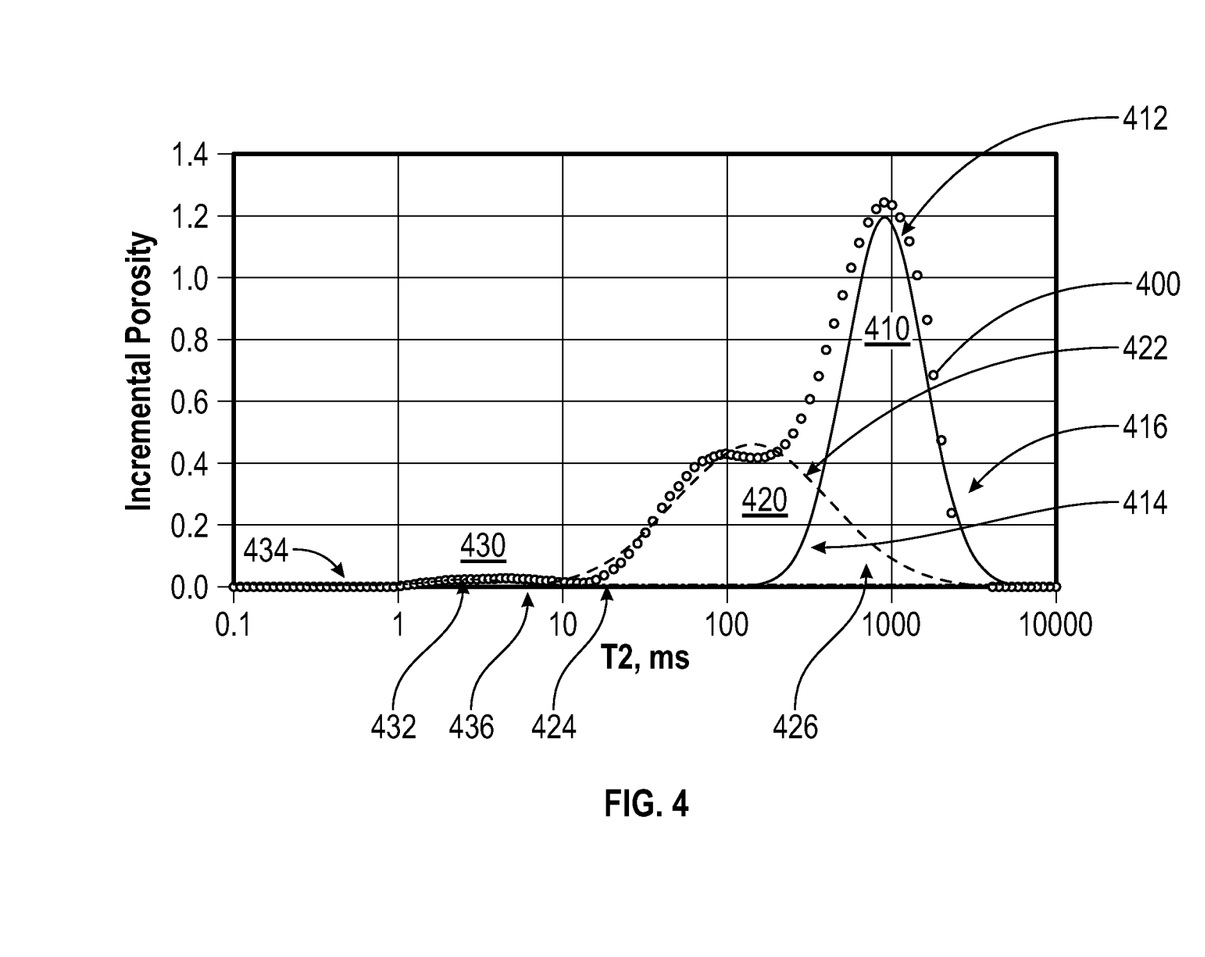
FIG. 4 shows an example of a Gaussian fitted $T_2$ distribution curve according to embodiments of the present disclosure.

According to embodiments of the present disclosure, different pore systems may be identified from $T_2$ distributions using Gaussian fitting. For example, FIG. 4 shows a $T_2$ distribution generated from NMR measurements of a multi-modal porous rock sample, where the $T_2$ distribution curve is formed of a plurality of data points 400 and has multiple peaks 410, 420, 430. Each of the peaks 410, 420, 430 may be fitted with a Gaussian curve 412, 422, 432 and may be used to identify different pore systems. In the example shown in FIG. 4, the $T_2$ distribution has three peaks 410, 420, 430 that are each fitted by a Gaussian curve 412, 422, 432, where each peak represents a different pore system within the rock.

Models based on NMR data alone may be skewed as being porosity driven and lack incorporation of pore throat size interaction. However, while $T_2$ distribution curves, such as shown in FIG. 4, may largely reflect the pore body size, $T_2$ distributions may also reflect pore throat size, such as when the pore throat is narrow and long. Additionally, the amplitude of each relaxation time may contain contributions from both pore bodies and pore throats of the same size. Pores of the shortest end 414, 424, 434 of each distribution will mostly represent the pore throats of each distribution (e.g., the pore throat 14 connecting to the small pores on the right in FIG. 1), while pores at the longest end 416, 426, 436 of each distribution will mostly represent the pore bodies of each distribution (e.g., the pore body 12 of the large pore on the left in FIG. 1).

Capillary pressure curves from MICP distributions may largely reflect pore throat size distribution versus the pore throat and pore body volume fraction which the pore throat size controls. Accordingly, capillary pressure distributions may sometimes be referred to as pore throat size distributions, where pore throat size distributions may also contain the volume fraction of a pore body of unknown size controlled by pore throat size in addition to the pore body volume fraction itself. At the smallest end of an MICP distribution, the curve mainly represents pore throats since all larger pore body should be filled.

Since the smaller ends of both an MICP distribution and a $T_2$ distribution may reflect a smallest pore throat size, the smaller ends of the MICP and $T_2$ distributions may be overlapped to obtain the surface relaxivity for each identified pore system. For example, when a $T_2$ distribution includes multiple peaks (each peak representing a different pore system), an MICP distribution of each representative pore system may be overlapped with the corresponding $T_2$ distribution curves to separately match corresponding peaks and calculate different scaling factors for each identified pore system.

Figure 5:
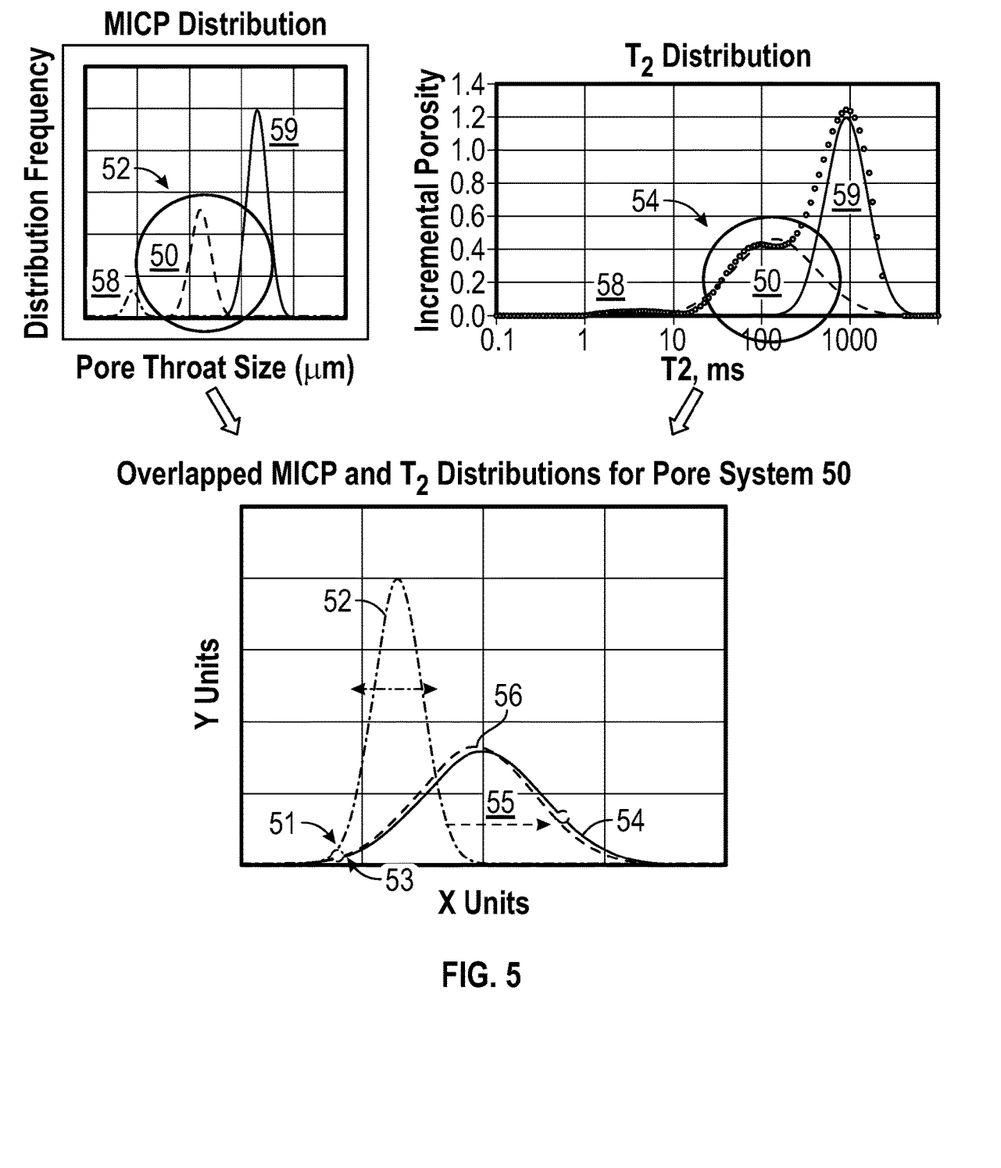
FIG. 5 shows a diagram of a method for overlapping a $T_2$ distribution and capillary pressure curve according to embodiments of the present disclosure.

FIG. 5 shows an example of corresponding MICP and $T_2$ distributions being overlapped in order to calculate a scaling factor for an identified pore system in a multi-modal porous rock having an identified first pore system 58, an identified second pore system 50, and an identified third pore system 59. In FIG. 5, an identified second pore system 50 in the MICP distribution 52 is compared with an identified second pore system 50 in the $T_2$ distribution 54 by matching the smaller ends 51, 53 of the corresponding distributions and overlapping the corresponding distributions, as shown in the Overlapped MICP and $T_2$ Distribution for Pore System 50 Graph of FIG. 5. In different pore systems, the pore body may be several times larger than the pore throat, such as shown in FIG. 1. Thus, when overlapping the corresponding MICP and $T_2$ distributions, the range of $T_2$ distribution may be much wider than the pore throat size distribution of the same pore system. Accordingly, when overlapping the MICP distribution 52 with the $T_2$ distribution 52, the MICP distribution 52 may be expanded or altered (represented by arrow 55) to match the corresponding peaks, as shown in the altered MICP distribution curve 56.

Once the MICP and $T_2$ distributions are overlapped, the surface relaxivity and the body-throat ratio of the pore system may be calculated, for example, using Equations 3 and 4. As described above, Equation 3 shows $T_2$ to be dependent on surface relaxivity, $\rho_2$, and pore body geometry (S/V). Equation 4 converts MICP pore radii to equivalent $T_2$ values, thereby providing a common scale for MICP and $T_2$ distributions. As shown in Equation 5, the product of the surface relaxivity parameter and the body-throat ratio parameter gives the scaling factor for the identified pore system.

The process shown in FIG. 5 and described above may be repeated for each identified pore system (e.g., for pore systems 58 and 59 shown in FIG. 5) to provide a scaling factor for each pore system in a multi-modal porous rock. By providing a scaling factor for each pore system in a multi-modal porous rock, the overall permeability of the porous rock may be more accurately calculated.

Model studies show that diffusion coupling between different pore systems may distort the $T_2$ distribution away from the actual pore size distribution if the pore systems are extensively connected. $T_2$ distribution of rock samples with multiple pore systems may also be affected by diffusion coupling depending on the degree of connectivity among pore systems. In most cases, the effect of diffusion coupling may be negligible. When large diffusion coupling is suspected between pore systems, it can be evaluated by running a $T_2$-store-$T_2$ NMR test. Performing one or more $T_2$-store-$T_2$ tests on a rock sample may allow for an analysis of diffusional pore to pore exchange, which may be used to characterize pore connectivity in the rock sample. A $T_2$-store-$T_2$ test may include a magnetization storage period (where the magnetization is held for a period of time for magnetization exchange to occur) between two $T_2$ encoding periods. Storage intervals may be selected based on the $T_2$ relaxation time and may increase from a short period of time (e.g., 20 ms) to a long period of time when the signal of the $T_2$-store-$T_2$ measurement approaches zero, for example.

If the diffusion coupling is significant, multiple $T_2$-store-$T_2$ tests may be run. Actual $T_2$ distributions may then be derived from apparent $T_2$ distributions from the one or more $T_2$-store-$T_2$ NMR tests. For example, when a $T_2$ distribution comprises at least two overlapping peaks, a $T_2$-store-$T_2$ NMR test may be run on the rock sample to determine diffusion coupling.

Figure 6:
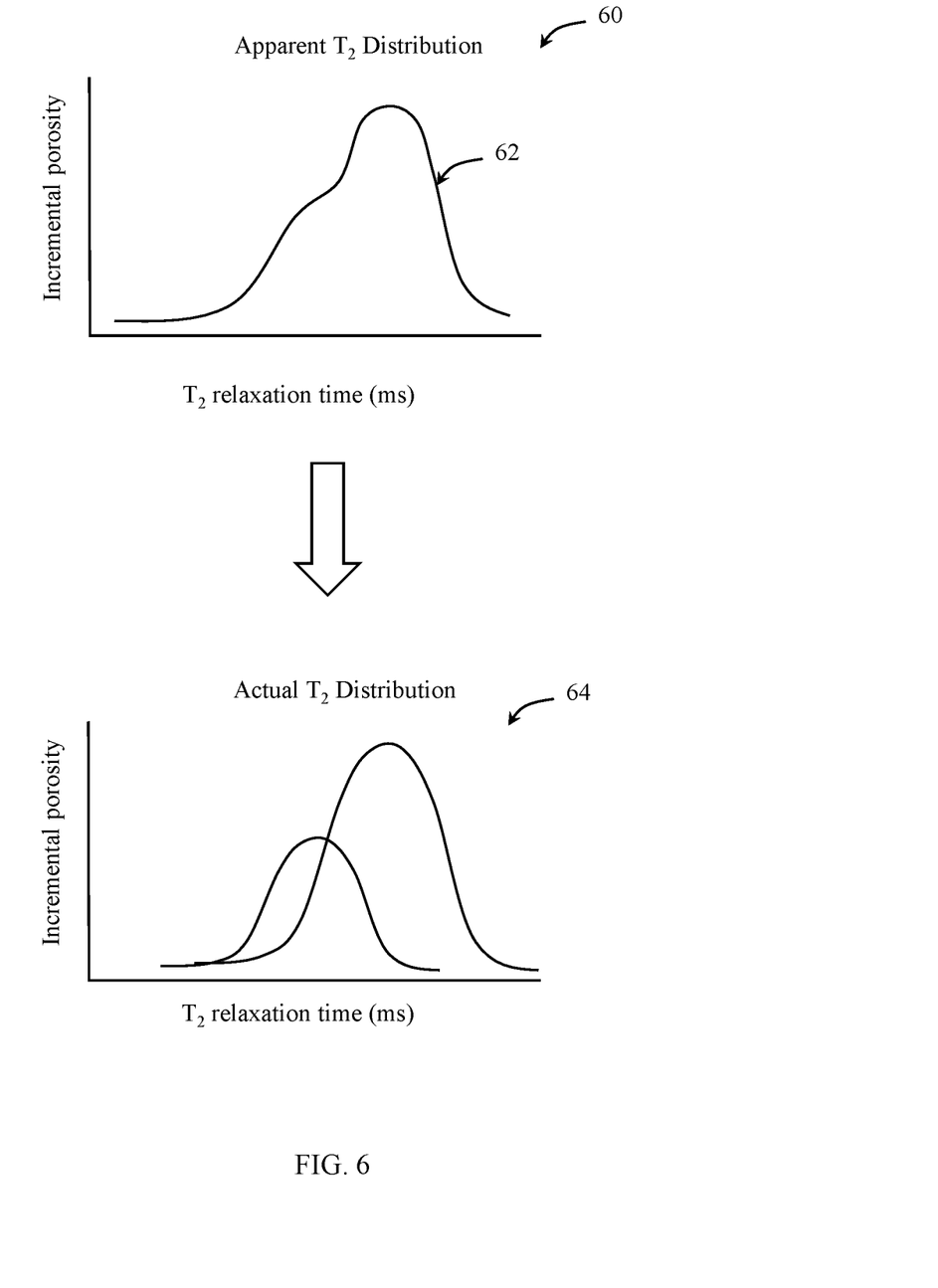
FIG. 6 shows a diagram of a method for deriving an actual $T_2$ distribution curve from an apparent $T_2$ distribution using one or more $T_2$-store-$T_2$ tests.

FIG. 6 shows an example of a process for using one or more $T_2$-store-$T_2$ tests. As shown, an apparent $T_2$ distribution 60 may be obtained, where the shape of a $T_2$ peak 62 may suggest that diffusion coupling is causing two peaks to overlap. In such case, a $T_2$-store-$T_2$ test may be performed. During the $T_2$-store-$T_2$ test, an NMR tool may pulse a magnetic field at different storage times increasing logarithmically from a low value (e.g., 20 ms) until the NMR signal approaches zero. The amplitude of diagonal peaks and off-diagonal peaks as the function of the storage time can be obtained from the $T_2$-store-$T_2$ maps. From the NMR data of the $T_2$-store-$T_2$ test, an actual $T_2$ distribution 64 may be derived from the apparent $T_2$ distribution 60 by fitting the obtained curves. Different pore systems in the rock sample may then be identified from the actual $T_2$ distribution 64, as described herein.

According to some embodiments, identified pore systems through this process may be saved and used later for subsequent NMR logging of the same and/or different wells having the same rock type.

Embodiments disclosed herein may be used to determine pore system characteristics in multi-modal rocks that may be used to more accurately assess permeability of the rocks. For example, methods disclosed herein may include generating a $T_2$ distribution of NMR data from a multi-modal porous rock sample; generating a capillary pressure distribution from MICP testing of a representative rock sample; decomposing the $T_2$ distribution using Gaussian fitting to identify multiple pore systems in the multi-modal porous rock sample; overlapping small ends of the Gaussian fitted $T_2$ distribution and the capillary pressure distribution for each of the identified pore systems; and matching peaks of the Gaussian fitted $T_2$ distribution and the capillary pressure distribution while the overlapped small ends are fixed. Once the curves from the $T_2$ and capillary pressure distributions for each identified pore system are overlayed, the surface relaxivity, pore body-throat ratio, and scaling factor for each pore system may be determined. For example, the surface relaxivity for each of the identified pore systems may be determined based on the overlapped small ends of the distributions; the scaling factor for each of the identified pore systems may be determined based on the surface relaxivity and the matched peaks of the distributions; and the pore body-throat ratio of each of the identified pore system may be determined based on the scaling factor and the surface relaxivity. The determined surface relaxivities and pore body-throat ratios may be used to convert pore throat and pore body sizes in same-type rocks as the multi-modal porous rock sample.

A $T_2$ distribution of multi-modal porous rock samples may be generated by running at least one $T_2$-store-$T_2$ NMR test to derive an actual $T_2$ distribution of the sample(s) when diffusion coupling is suspected to affect an initial $T_2$ distribution.

Further, accuracy of a pore system analysis may be improved by assessing the heterogeneity of a multi-modal porous rock sample and drilling a representative rock sample prior to fitting and matching $T_2$ and capillary pressure distributions. Heterogeneity of a multi-modal porous rock sample may be assessed, for example, by running an NMR logging tool downhole to obtain a spatial $T_2$ distribution of the multi-modal porous rock sample, and/or by performing at least one geological test on the multi-modal porous rock sample in a lab.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed:
1. A method, comprising:
   screening heterogeneity of a rock sample using nuclear magnetic resonance testing to determine a composition of the rock sample;

drilling at least one smaller rock sample representative of the determined composition;

testing the at least one smaller rock sample with mercury injection capillary pressure to obtain a capillary pressure distribution of the at least one smaller rock sample;

decomposing a $T_2$ distribution from the nuclear magnetic resonance testing and the capillary pressure distribution using Gaussian fitting to identify multiple pore systems; and overlapping small ends of the Gaussian fitted $T_2$ distribution and the Gaussian fitted capillary pressure distribution for at least one of the identified pore systems.

2. The method of claim 1, wherein the rock sample is carbonate rock.

3. The method of claim 1, wherein the at least one smaller rock sample is taken from a depth in a well that is approximately the same as the rock sample.

4. The method of claim 1, wherein the heterogeneity of the rock sample is screened using an NMR logging tool while the rock sample is underground.

5. The method of claim 1, wherein the heterogeneity of the rock sample is screened above ground.

6. The method of claim 1, wherein when the $T_2$ distribution comprises at least two overlapping peaks, further comprising running a $T_2$-store-$T_2$ nuclear magnetic resonance test on the rock sample to determine diffusion coupling.

7. A method, comprising:
generating a $T_2$ distribution of nuclear magnetic resonance data from a multi-modal carbonate rock sample;
generating a capillary pressure distribution from mercury injection capillary pressure testing of a representative rock sample;
decomposing the $T_2$ distribution using Gaussian fitting to identify at least one pore system in the multi-modal carbonate rock sample, the at least one pore system comprising a first pore system;
overlapping small ends of the Gaussian fitted $T_2$ distribution and the capillary pressure distribution for the first pore system; and
calculating a scaling factor for the first pore system.

8. The method of claim 7, wherein calculating the scaling factor comprises:
determining a surface relaxivity of the pore system from the overlapped small ends; and
matching high ends of the Gaussian fitted $T_2$ distribution and the capillary pressure distribution to determine a body-throat ratio of the pore system.

9. The method of claim 7, further comprising:
identifying a second pore system from the decomposed $T_2$ distribution;
overlapping the small ends of the Gaussian fitted $T_2$ distribution and the capillary pressure distribution for the second pore system; and
calculating a second scaling factor for the second pore system.

10. The method of claim 7, further comprising running $T_2$-store-$T_2$ nuclear magnetic resonance testing on the multi-modal carbonate rock sample.

11. The method of claim 7, wherein the NMR data is collected from an NMR logging tool.

12. The method of claim 7, wherein the multi-modal carbonate rock sample and the representative rock sample are from the same rock.

13. A method, comprising:
generating a $T_2$ distribution of nuclear magnetic resonance data from a multi-modal porous rock sample;
generating a capillary pressure distribution from mercury injection capillary pressure testing of a representative rock sample;
decomposing the $T_2$ distribution using Gaussian fitting to identify multiple pore systems in the multi-modal porous rock sample;
overlapping small ends of the Gaussian fitted $T_2$ distribution and a Gaussian fit of the capillary pressure distribution for each of the identified pore systems;
matching peaks of the Gaussian fitted $T_2$ distribution and the Gaussian fitted capillary pressure distribution while the overlapped small ends are fixed;
determining a surface relaxivity for each of the identified pore systems based on the overlapped small ends of the distributions;
determining a scaling factor for each of the identified pore systems based on the surface relaxivity and the matched peaks of the distributions; and
determining a pore body-throat ratio of each of the identified pore system based on the scaling factor and the surface relaxivity.

14. The method of claim 13, further comprising using the surface relaxivity and the pore body-throat ratio to convert pore throat and pore body sizes in same-type rocks as the multi-modal porous rock sample.

15. The method of claim 13, wherein the multi-modal porous rock sample is a carbonate rock.

16. The method of claim 13, wherein generating the $T_2$ distribution of the multi-modal porous rock sample comprises running at least one $T_2$-store-$T_2$ nuclear magnetic resonance test to derive an actual $T_2$ distribution.

17. The method of claim 13, further comprising assessing heterogeneity of the multi-modal porous rock sample and drilling the representative rock sample prior to generating the capillary pressure distribution.

18. The method of claim 17, wherein assessing heterogeneity comprises running a nuclear magnetic resonance logging tool downhole to obtain a spatial $T_2$ distribution of the multi-modal porous rock sample.

19. The method of claim 17, wherein assessing heterogeneity comprises performing at least one geological test on the multi-modal porous rock sample in a lab.

20. The method of claim 13, wherein at least three pore systems are identified in the multi-modal porous rock sample.

* * * * *